United States Patent
Huang et al.

(10) Patent No.: US 10,651,833 B2
(45) Date of Patent: May 12, 2020

(54) CONTROLLABLE SPLITTING METHOD FOR HIGH CURRENT PULSE AND APPARATUS THEREFOR

(71) Applicants: SHANGHAI INSTITUTE OF CERAMICS, CHINESE ACADEMY OF SCIENCES, Shanghai (CN); R&D CENTER, SHANGHAI INSTITUTE OF CERAMICS, Shanghai (CN)

(72) Inventors: Wei Huang, Shanghai (CN); Erwei Shi, Shanghai (CN)

(73) Assignees: SHANGHAI INSTITUTE OF CERAMICS, CHINESE ACADEMY OF SCIENCES, Shanghai (CN); R&D CENTER, SHANGHAI INSTITUTE OF CERAMICS, Shanghai (CN)

(*) Notice: Subject to any disclaimer, the term of this patent is extended or adjusted under 35 U.S.C. 154(b) by 27 days.

(21) Appl. No.: 16/062,777

(22) PCT Filed: Dec. 31, 2015

(86) PCT No.: PCT/CN2015/100259
§ 371 (c)(1),
(2) Date: Jun. 15, 2018

(87) PCT Pub. No.: WO2017/101167
PCT Pub. Date: Jun. 22, 2017

(65) Prior Publication Data
US 2019/0296721 A1    Sep. 26, 2019

(30) Foreign Application Priority Data
Dec. 17, 2015    (CN) .......................... 2015 1 0948411

(51) Int. Cl.
H03B 19/06 (2006.01)
H03K 5/04 (2006.01)
H03K 17/78 (2006.01)

(52) U.S. Cl.
CPC ............... *H03K 5/04* (2013.01); *H03K 17/78* (2013.01)

(58) Field of Classification Search
CPC ........ H01S 3/005; H01S 3/0057; H01S 3/225; B23K 26/067
See application file for complete search history.

(56) References Cited

U.S. PATENT DOCUMENTS

| 5,278,854 A | 1/1994 | Kim et al. |
| 5,804,815 A | 9/1998 | Loubriel et al. |

(Continued)

FOREIGN PATENT DOCUMENTS

| CN | 1801548 A | 7/2006 |
| CN | 101282113 A | 10/2008 |

(Continued)

OTHER PUBLICATIONS

Yuan et al., "Developments and Applications of Photoconductive Semiconductor Switches in Pulsed Power Technology," High Power Laser and Particle Beams, vol. 20, No. 01, Jan. 31, 2008, 5 pages.

(Continued)

*Primary Examiner* — Sibin Chen
(74) *Attorney, Agent, or Firm* — Alleman Hall Creasman & Tuttle LLP

(57) ABSTRACT

A controllable splitting method comprises: electrically connecting a photoconductive switch between input and output ends of a current pulse; connecting a time domain signal of the input current pulse to an external triggering port of a pulse laser; emitting a laser pulse to irradiate the switch; when no current pulse is input, failing to receive an external (Continued)

triggering signal and not outputting the laser pulse, the switch being in an off state without the irradiation of the laser pulse, and no current being output; when the current pulse is input, triggering the pulse laser to synchronously output the laser pulse on a time domain, irradiating the switch so that the switch is in an on state and the current pulse is output; and forming, at the output end, a current pulse signal synchronous with a time domain of the input end and having a split waveform.

11 Claims, 3 Drawing Sheets

(56) References Cited

U.S. PATENT DOCUMENTS

| | | |
|---|---|---|
| 5,811,841 A | 9/1998 | Ganguly et al. |
| 5,864,166 A | 1/1999 | Stoudt et al. |

| | | | |
|---|---|---|---|
| 2010/0014079 A1* | 1/2010 | Yamashita | G01J 3/42 356/303 |
| 2011/0133203 A1 | 6/2011 | Werne et al. | |

FOREIGN PATENT DOCUMENTS

| | | |
|---|---|---|
| CN | 102157597 A | 8/2011 |
| CN | 104350571 A | 2/2015 |

OTHER PUBLICATIONS

Liu et al., "Factors Affecting Minimum On-state Resistance of SiC Photoconductive Semiconductor Switch," High Power Laser and Particle Beams, vol. 24, No. 3, Mar. 31, 2012, 6 pages.

Zhou et al., "Fabrication and Properties of V-doped Semi-insulating 6H-SiC Photoconductive Semiconductor Switch," High Power Laser and Particle Beams, vol. 26, No. 4, Apr. 30, 2014, 5 pages ISA State Intellectual Property Office of the People's Republic of China, International Search Report Issued in Application No. PCT/CN2015/100259, dated Sep. 28, 2016, 6 pages.

* cited by examiner

CONTROLLABLE SPLITTING METHOD FOR HIGH CURRENT PULSE AND APPARATUS THEREFOR

FIELD OF THE INVENTION

The present application belongs to the field of pulse power technology, and in particular, relates to a controllable splitting method for a high current pulse and an apparatus therefore.

BACKGROUND OF THE INVENTION

Pulse power technology involves many defense and cutting-edge technology fields such as high-power radars, large-scale accelerators, high-power pulsed power supplies, etc. The core of pulse power technology is the precise control of high current pulses on the time domain and amplitude, so as to achieve accurate operation of radars, accelerators, and other devices. Therefore, it is important to study the control of the current pulse waveform in the pulse power field.

The control of the current pulse waveform includes the compression of the pulse width, the splitting of a single pulse, and the like, to meet the operational requirements of the pulse power systems. The traditional method uses electrical components to achieve this. However, currently the relevant electrical components are mostly made of semiconductor silicon materials, the performance of the components is limited by the physical properties of the silicon material itself, and thus its ability to withstand high voltage and high current is very limited. Therefore, in the operating conditions of a magnitude of tens to hundreds of kilovolts and kiloamperes which are common in the field of pulse power technology, a large number of components are required to realize the regulation of the current pulse waveform, resulting in a large volume and a high power loss.

As the preparation technology of wide bandgap semiconductor materials is getting increasingly mature, people have turned their attention to using wide bandgap semiconductor materials for high-power photoconductive switches. Silicon carbide, as a representative of wide bandgap semiconductors, has more prominent advantages than other wide bandgap semiconductor materials—that is, a high critical breakdown field strength and a high thermal conductivity, which were absent in the conventional semiconductor materials such as silicon. According to the characteristics of silicon carbide materials, a number of silicon carbide photoconductive switches have been proposed in recent years. The on and off states of such switches are controlled by a laser signal, which is very simple and accurate. At the same time, because of the excellent physical properties of silicon carbide materials, a single silicon carbide switch can withstand high-power operating environments of a magnitude of tens to hundreds of kilovolts and kiloamperes. Such a switch is the ideal switch that is expected in the field of pulse power, which switch will make the pulse power system be greatly simplified, has a reduced size, a lower cost, and improved stability, and thus is of great significance to the defense technology and other fields.

SUMMARY OF THE INVENTION

In view of the above problems in the prior art, the technical problem to be solved by the present application is to provide a controllable splitting method for a high current pulse and an apparatus therefore, which have the advantages of being compact, small in size, and simple with regard to control system compared with conventional methods and apparatuses.

In order to solve the above technical problems, in one aspect, the present application provides a controllable splitting method for a high current pulse, including:

(1) Electrically connecting a photoconductive switch between an input end and an output end of a current pulse;

(2) Connecting a time-domain signal of an input current pulse to an external triggering port of a pulse laser;

(3) Irradiating a laser pulse emitted by the pulse laser to the photoconductive switch;

(4) When no current pulse is input at the input end, the pulse laser failing to receive an external trigger signal, and to output the laser pulse, the photoconductive switch being in an off state without the irradiation of the laser pulse, and no current being output from the output end;

(5) When a current pulse is input at the input end, a time-domain signal triggering the pulse laser so that the pulse laser synchronously outputs a laser pulse on the time domain, the laser pulse irradiating the photoconductive switch so that the photoconductive switch is in an on state and a current pulse is output from the output end;

(6) Controlling the waveform of the current pulse by the parameters of the photoconductive switch so that a current pulse signal having a split waveform is formed at the output end in synchronization with the time domain of the input end.

According to the present application, the controllable splitting method of a high current pulse can split the time-domain signal of the Gaussian-like distributed current pulse, which is currently common in the pulsed power system, so that a single current pulse peak can be split into multiple current pulse peaks with narrower widths.

A photoconductive switch is directly connected to the input and output of a high current pulse. The photoconductive switch is in an off state when there is no laser excitation, and the entire apparatus has no output. When there is a high current pulse input, the time-domain signal serves as an external trigger source for the pulse laser, so that the pulse laser synchronously outputs a laser pulse. This laser pulse excites the photoconductive switch so that the photoconductive switch turns into an on state within a duration of a laser pulse, and thus a current pulse is output at the output end. Because of the special physical properties of the photoconductive switch, the output current pulse varies according to the parameters such as the excitation light intensity, the electrode spacing, etc., thereby realizing regulation of the splitting waveform of the output current pulse.

In addition, in the present application, it is also possible that the photoconductive switch is a planar silicon carbide photoconductive switch whose silicon carbide substrate is high-purity semi-insulating silicon carbide, vanadium-doped semi-insulating silicon carbide, or unintentionally doped semi-insulating silicon carbide.

According to the present application, the function of realizing the splitting of a high current peak is mainly determined by the special physical properties of the planar silicon carbide photoconductive switch under light excitation. Because of the special physical properties of the planar silicon carbide photo-conductive switch, the output current pulse varies according to the parameters such as the excitation light intensity, the planar silicon carbide electrode spacing, etc., which is beneficial to realize the regulation of the splitting waveform of the output current pulse. High-purity semi-insulating silicon carbide, vanadium-doped semi-insulating silicon carbide, or unintentionally doped semi-insulating silicon carbide will produce carriers with different generation and trapping effects due to the difference in the impurity levels, and thus different split waveforms are shown in the output current pulse peaks.

In addition, in the present application, the number of split peaks in the output current pulse signal having a split waveform may be from 2 to 10.

According to the present application, in the case of the same input current value, the output current pulse generates different numbers of split peaks, and individual current peaks of different current values can be generated, so that output current pulses of different current values can be obtained by adjusting the number of split peaks.

In addition, in the present application, it is also possible that the laser pulse output from the pulse laser has a wavelength ranging from 100 nm to 1064 nm.

According to the present application, excitation laser pulses with different wavelengths can excite carriers at different impurity levels, and therefore, the different wavelengths of excitation laser pulses can adjust the magnitude of the output pulse current.

In addition, in the present application, it is also possible that the intensity of the laser pulse output from the pulse laser is in the range from 5 $\mu J/mm^2$ to 5000 $\mu J/mm^2$.

According to the present application, by adjusting the intensity of the excitation laser pulse, different concentrations of photocarriers can be obtained, so that the output current values can be effectively adjusted, and the number of split peaks can also be adjusted.

In another aspect, the present application also provides an apparatus for implementing the controllable splitting method for a high current pulse as described above, comprising: a photoconductive switch electrically connected between an input end and an output end of a current pulse; and a pulse laser receiving a time-domain signal of an input current pulse, a laser pulse emitted by the pulse laser being irradiated to the photoconductive switch.

According to the present application, a time-domain signal of a Gaussian-like distributed current pulse, which is common in current pulsed power systems, can be split by the apparatus so that a single current pulse peak is split into a plurality of current pulse peaks having narrower widths.

In addition, in the present application, the pulse width in the time domain of an output pulse from the pulse laser may be in the range from 0.01 nanoseconds to 1000 nanoseconds.

According to the present application, by adjusting the pulse width in the time domain of the output pulse of the pulse laser, the overall pulse width of the output current peak can be simultaneously regulated.

In addition, in the present application, the photoconductive switch may be a planar photoconductive switch, and preferably selected from a group consisting of a planar silicon carbide photoconductive switch, a planar gallium nitride photoconductive switch, a planar diamond photoconductive switch, a planar gallium arsenide photoconductive switch, and a planar indium phosphide photoconductive switch.

According to the present application, different wide bandgap semiconductor materials such as gallium nitride, diamond, gallium arsenide, or indium phosphide are selected to prepare the planar photoconductive switch of the present application. Since these materials have different respective semiconductor physical properties, the responses to laser excitation are different, and the distributions of impurity levels are different. Therefore, by using these different materials, the output current value and the number of pulse peak splits can be adjusted in a wider range.

The foregoing and other objects, features, and advantages of the present application will be better understood from the following detailed description and with reference to the drawings.

REFERENCE CHARACTERS

1—pulse high-voltage source; 11—input end; 12—output end; 2—silicon carbide photoconductive switch; 3—pulse laser; 4—first high-voltage withstanding precision resistor; 5—second high-voltage withstanding precision resistor; 6—oscilloscope; 61, 62—probe; 7—photocell; 8—cable.

DETAILED DESCRIPTION OF THE EMBODIMENTS

Hereinafter, the apparatus and the method of the present application will be described in detail with reference to the accompanying drawings. Those skilled in the art should understand that the present application can have many different forms without departing from the scope and essence of the present application. The following detailed description is provided to make the disclosure more thorough and complete, so as to fully convey the scope of the present application to those skilled in the art.

In view of the existing defects in the control of current pulse waveform in the technology field of pulse power, the present application provides a novel and simple controllable method and apparatus for splitting high current pulses utilizing a silicon carbide photoconductive switch which is a new high-performance switching device, as well as utilizing the physical phenomenon that the silicon carbide photoconductive switch can regulate the waveform of a current pulse flowing through it, which is discovered by the inventor in the research for the first time. The method and the apparatus have important potential application value in the field of pulse power technology, and have great significance in defense and frontier science and technology and other fields.

Figure 1:
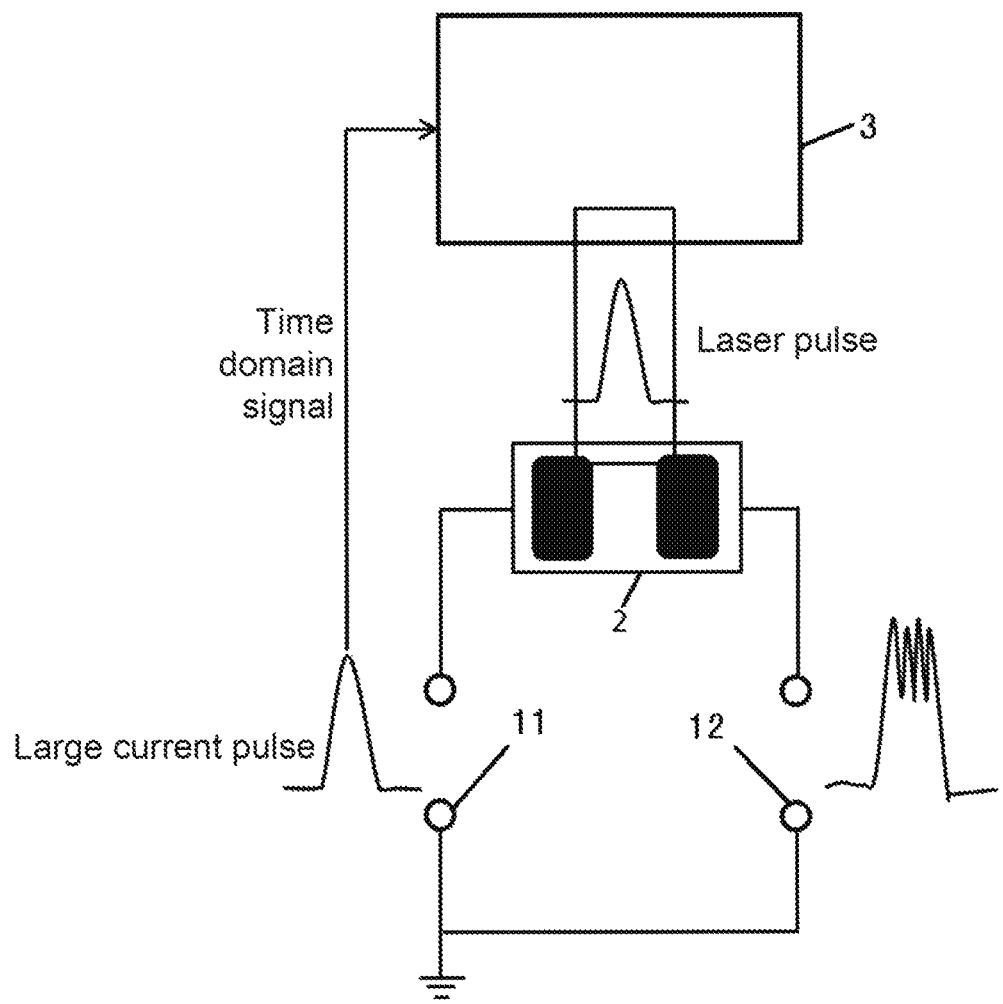
FIG. 1 is a schematic diagram of a controllable splitting method for a high current pulse according to an embodiment of the present application.
Figure 2:
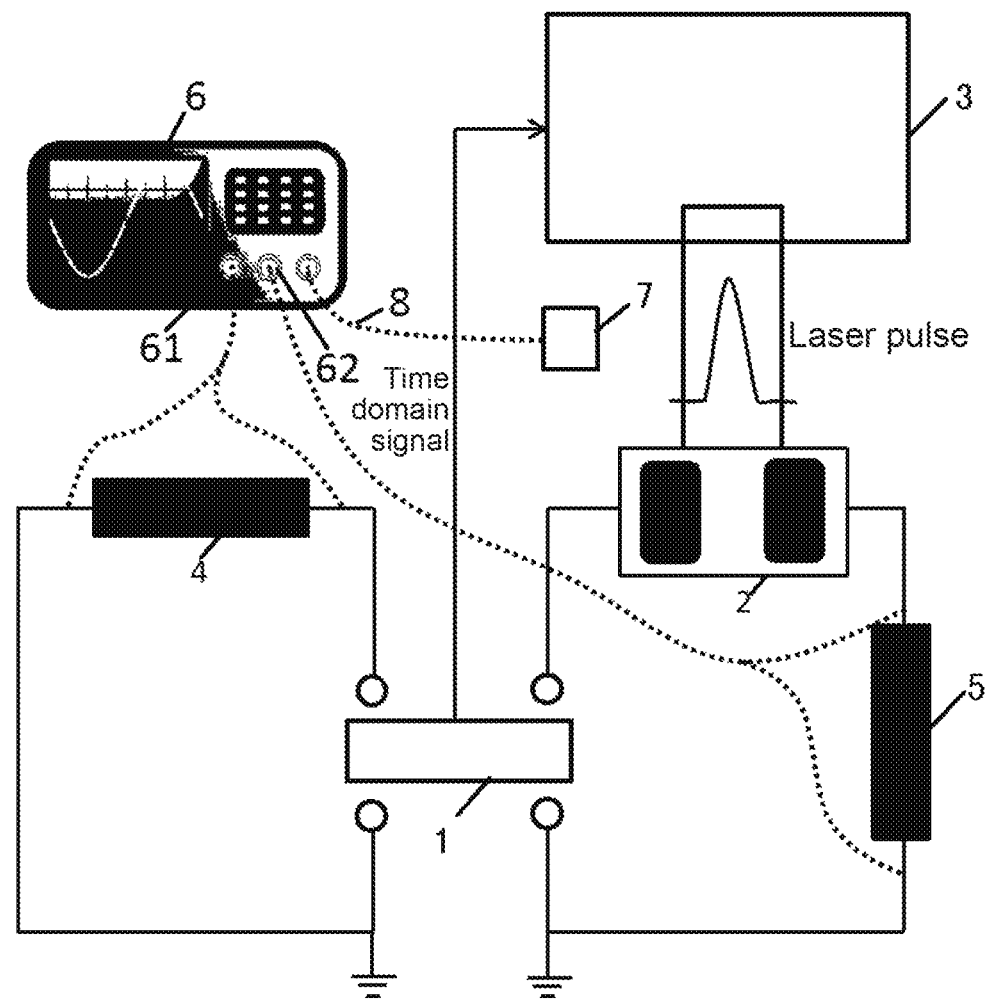
FIG. 2 is a schematic structural view of an apparatus for implementing the method shown in FIG. 1.

FIG. 1 is a schematic diagram of a controllable splitting method for a high current pulse according to an embodiment of the present application, and FIG. 2 is a schematic structural view of an apparatus for implementing the method shown in FIG. 1.

As shown in FIG. 1 and FIG. 2, a controllable splitting method for a high current pulse according to the present application includes the following steps:

1) Electrically connecting a silicon carbide photoconductive switch between an input end and an output end of a current pulse, wherein the silicon carbide photoconductive switch may be a planar silicon carbide photoconductive switch;

2) Connecting a time-domain signal of an input current pulse to an external triggering port of a pulse laser;

3) Irradiating a laser pulse emitted by the pulse laser to the planar silicon carbide photoconductive switch;

4) When no current pulse is input at the input end, the pulse laser failing to receive the external trigger signal, and to output the laser pulse, the silicon carbide photoconductive switch being in an off state without laser pulse irradiation, and no current being output from the output end;

5) When a current pulse is input at the input end, a time-domain signal triggering the pulse laser, so that the pulse laser synchronously outputs a laser pulse on the time domain, the laser pulse irradiating the silicon carbide photoconductive switch so that the silicon carbide photoconductive switch is in an on state and a current pulse is output from the output end; and 6) The current flowing through the planar silicon carbide photoconductive switch, and the waveform of the current pulse being controlled by the relevant parameters of the photoconductive switch, so that a current pulse signal having certain split waveform is formed at the output end in synchronization with the time domain of the input end.

In the above steps, it is preferable that the peak current of the current pulse ranges from 10 amps to 10000 amps, and the pulse width in the time domain of the current pulse ranges from 0.01 ns to 1000 ns.

In addition, the silicon carbide substrate of the planar silicon carbide photoconductive switch described above may be high-purity semi-insulating silicon carbide, vanadium-doped semi-insulating silicon carbide, or unintentionally doped semi-insulating silicon carbide.

In addition, in the above method, the number of split peaks in the output current pulse signal having a split waveform is from 2 to 10.

Also, in the above steps, it is preferable that the pulse laser has a wavelength ranging from 100 nm to 1064 nm, and the laser pulse has an intensity ranging from 5 $\mu J/mm^2$ to 5000 $\mu J/mm^2$.

On the other aspect, an apparatus for implementing a controllable splitting method for a high current pulse according to an embodiment of the present application includes: a pulse laser, a planar silicon carbide photoconductive switch, an optical path, and a connection cable. Preferably, the optical path may be connected in the form of a group of optical paths or only optical fibers. Also, the pulse width in the time domain of the output pulse from the pulse laser may range from 0.01 nanoseconds to 1000 nanoseconds.

In addition, more preferably, the planar silicon carbide photoconductive switch may be a planar gallium nitride photoconductive switch, a planar diamond photoconductive switch, a planar gallium arsenide photoconductive switch, or a planar indium phosphide photoconductive switch.

Compared with the current method of controlling the waveform of a current pulse simply by electrical elements in the field of pulse power technology, the present application provides a method and an apparatus for controllable splitting of a high current pulse with the following beneficial technical effects: In addition to the optical path connection and electrical connection, the entire apparatus only has two main components—a pulse laser and a silicon carbide photoconductive switch—which makes the apparatus overall simple, easy to control, and high in stability.

The preferred examples of the present application will be further described in detail below with reference to the accompanying drawings.

EXAMPLE 1

In the embodiment shown in FIG. 1, a controllable splitting method and apparatus for a high current pulse of the present application includes a pulse laser 3, a planar silicon carbide photoconductive switch 2, an optical path, and a connection cable 8. The following examples implement the method and apparatus of the present application by using the circuit connection manner shown in FIG. 2, and specifically the following steps are performed.

1) A pulse high-voltage source 1 is used as the input of the high current pulse, and its positive electrode is electrically connected to the positive electrode of the photoconductive switch 2 and to the positive electrode of a first high-voltage withstanding precision resistor 4 on the left. The time-domain signal of the pulse high-voltage source 1 is electrically connected to the external triggering port of the pulse laser 3.

2) The negative electrode of the pulse high-voltage source 3 and the negative electrodes of the two high-voltage withstanding precision resistors 4 and 5 are connected electrically to the ground.

3) The negative electrode of the photoconductive switch 2 is connected electrically to the positive electrode of the second high-voltage withstanding precision resistor 5 on the right.

4) A laser spot emitted from the pulse laser 3 is irradiated to the planar silicon carbide photoconductive switch 2 by means of a set of reflecting mirrors (not shown).

5) A photocell 7 is used to receive the scattered light of the laser, and output the laser pulse signal to the oscilloscope 6.

6) The oscilloscope 6 collects the voltage signals at the two ends of the two high-voltage precision resistors 4, 5 through two probes 61, 62, respectively. The voltage signals are connected to two different ports of the oscilloscope 6.

Figure 3:
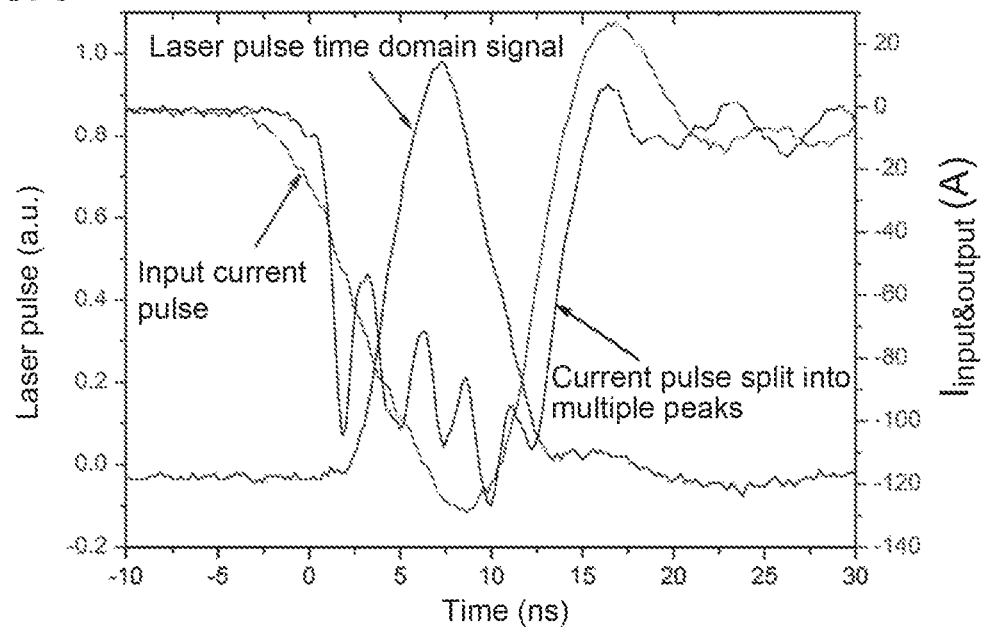
FIG. 3 is a graph illustrating the result of splitting a high current pulse according to the method of the first example of the present application.

In Example 1, a photoconductive switch 2 having an electrode spacing of 5 mm is utilized, which is prepared using a vanadium-doped silicon carbide substrate, and a single-pulse laser intensity is 150 $\mu J/mm^2$. FIG. 3 is a graph showing the results of the splitting of a high current pulse according to the method of Example 1 of the present application, and the output current pulse from the apparatus of the present application when the input peak current is 130 amps is shown. It can be seen that the output current pulse is split regularly into 5 peaks with peak values between 100 amps and 130 amps.

EXAMPLE 2

The method and apparatus of the present application are implemented using the circuit connection shown in FIG. 2, specifically according to the following steps.

1) A pulse high-voltage source 1 is used as the input of the high current pulse, and its positive electrode is electrically connected to the positive electrode of the photoconductive switch 2 and to the positive electrode of a first high-voltage withstanding precision resistor 4 on the left. The time-domain signal of the pulse high-voltage source 1 is electrically connected to the external triggering port of the pulse laser 3.

2) The negative electrode of the pulse high-voltage source 3 and the negative electrodes of the two high-voltage withstanding precision resistors 4 and 5 are connected electrically to the ground.

3) The negative electrode of the photoconductive switch 2 is connected electrically to the positive electrode of the second high-voltage withstanding precision resistor 5 on the right.

4) A laser spot emitted from the pulse laser 3 is irradiated to the planar silicon carbide photoconductive switch 2 by means of a set of reflecting mirrors (not shown).

5) A photocell 7 is used to receive the scattered light of the laser and output the laser pulse signal to the oscilloscope 6.

6) The oscilloscope 6 collects the voltage signals at the two ends of the two high-voltage precision resistors 4, 5 through two probes 61, 62, respectively. The voltage signals are connected to two different ports of the oscilloscope 6.

Figure 4:
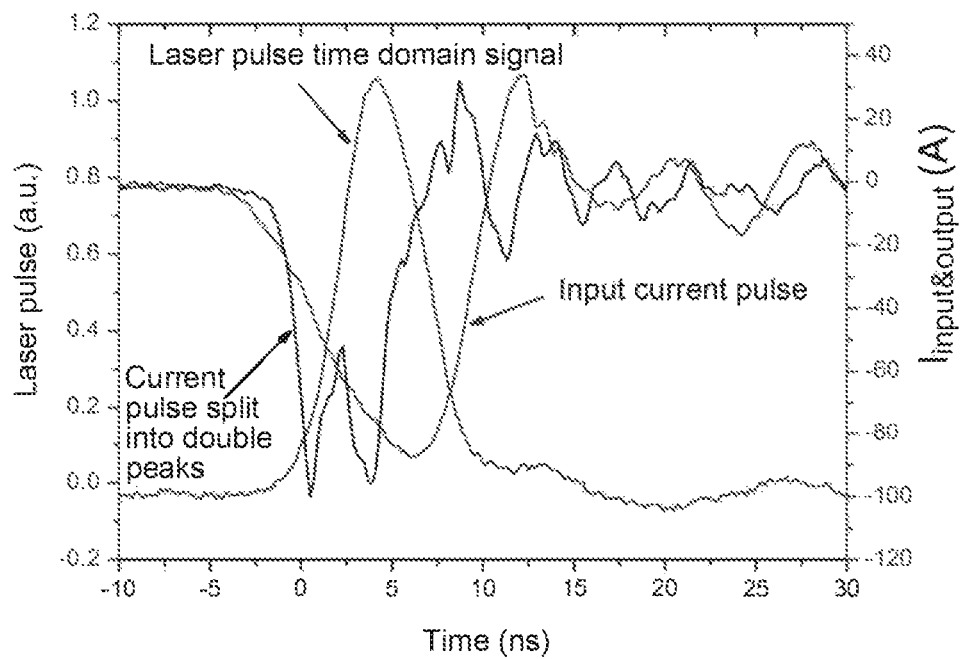
FIG. 4 is a graph illustrating the result of splitting a high current pulse according to the method of the second example of the present application.

In Example 2, a photo-conductive switch having an electrode spacing of 10 mm is utilized, which is prepared using an unintentionally doped silicon carbide substrate, and the single-pulse laser light has an intensity of 350 μJ/mm². FIG. 4 is a graph showing the results of the splitting of a high current pulse according to the method of Example 2 of the present application, and the output current pulse from the apparatus of the present application when the input peak current is 90 ampere is shown. It can be seen that the output current pulse is split regularly into 2 peaks whose peak values are between 90 amps and 100 amps, and which are close to each other.

The invention can be embodied in many forms without departing from the essential natures of the application, and the embodiments of the application are intended to be illustrative and not restrictive. The scope of the invention is defined by the claims rather than the specification, and all modifications which fall within the scope of the claims, or equivalents of the scope of the invention, are to be included in the claims.

The invention claimed is:

1. A controllable splitting method for a current pulse, comprising the steps of:
   (1) electrically connecting a photoconductive switch between an input end and an output end of a current pulse circuit for the current pulse;
   (2) connecting a time-domain signal of the current pulse that is input to an external triggering port of a pulse laser to serve as an external trigger signal;
   (3) irradiating a laser pulse emitted by the pulse laser to the photoconductive switch;
   (4) when no current pulse is input at the input end, the pulse laser failing to receive the external trigger signal, and to output the laser pulse, the photoconductive switch being in an off state without the irradiation of the laser pulse, and no current being output from the output end;
   (5) when the current pulse is input at the input end, the time-domain signal triggering the pulse laser so that the pulse laser synchronously outputs a laser pulse on a time domain, the laser pulse irradiating the photoconductive switch so that the photoconductive switch is in an on state and an output current pulse with an output current pulse signal is output from the output end;
   (6) controlling the waveform of the current pulse by parameters of the photoconductive switch so that a current pulse signal having a split waveform is formed at the output end in synchronization with the time domain of the input end.

2. The controllable splitting method for the current pulse according to claim 1, wherein a peak current of the current pulse ranges from 10 amps to 10000 amps.

3. The controllable splitting method for the current pulse according to claim 1, wherein a pulse width of the time domain of current pulse ranges from 0.01 ns to 1000 ns.

4. The controllable splitting method for the current pulse according to claim 1, wherein the photoconductive switch is a planar silicon carbide photoconductive switch, and a silicon carbide substrate thereof is high-purity semi-insulating silicon carbide, vanadium-doped semi-insulating silicon carbide, or unintentionally doped semi-insulating silicon carbide.

5. The controllable splitting method for the current pulse according to claim 1, wherein a number of split peaks in the output current pulse signal having a split waveform is from 2 to 10.

6. The controllable splitting method for the current pulse according to claim 1, wherein the laser pulse output from the pulse laser has a wavelength ranging from 100 nm to 1064 nm.

7. The controllable splitting method for the current pulse according to claim 1, wherein the laser pulse output from the pulse laser has an intensity ranging from 5 μJ/mm² to 5000 μJ/mm².

8. An apparatus for implementing the controllable splitting method for the current pulse according to claim 1, comprising:
   the photoconductive switch electrically connected between the input end and the output end of the current pulse; and
   the pulse laser receiving the time-domain signal of the current pulse that is input, a laser pulse emitted by the pulse laser being irradiated to the photoconductive switch.

9. The apparatus for implementing the controllable splitting method for the current pulse according to claim 8, wherein a pulse width in the time domain of an output pulse from the pulse laser is in a range from 0.01 nanoseconds to 1000 nanoseconds.

10. The apparatus for implementing the controllable splitting method for the current pulse according to claim 8, wherein the photoconductive switch is a planar photoconductive switch.

11. The apparatus for implementing the controllable splitting method for the current pulse according to claim 10, wherein the photoconductive switch is selected from a group consisting of a planar silicon carbide photoconductive switch, a planar gallium nitride photoconductive switch, a planar diamond photoconductive switch, a planar gallium arsenide photoconductive switch, and a planar indium phosphide photoconductive switch.

* * * * *